United States Patent
Fukumoto

(10) Patent No.: US 7,187,582 B2
(45) Date of Patent: Mar. 6, 2007

(54) ERRONEOUS OPERATION PREVENTING CIRCUIT OF NON-VOLATILE MEMORY DEVICE

(75) Inventor: Katsumi Fukumoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 117 days.

(21) Appl. No.: 10/824,831

(22) Filed: Apr. 14, 2004

(65) Prior Publication Data

US 2004/0264268 A1    Dec. 30, 2004

(30) Foreign Application Priority Data

Apr. 14, 2003    (JP)    ............................. 2003-109252

(51) Int. Cl.
*G11C 16/04*    (2006.01)
(52) U.S. Cl. ........................ 365/185.04; 365/185.09; 365/200; 714/766
(58) Field of Classification Search ................ 365/200, 365/185.09, 185.04; 714/766
See application file for complete search history.

(56) References Cited

U.S. PATENT DOCUMENTS 5,381,369 A * 1/1995 Kikuchi et al. ........ 365/185.04
6,188,605 B1 * 2/2001 Nomura et al. ........ 365/185.11
2002/0015336 A1 * 2/2002 Watkins et al. ............. 365/200

FOREIGN PATENT DOCUMENTS

| JP | 09-069066 | 3/1997 |
| JP | 2002-366436 | 12/2002 |

* cited by examiner

*Primary Examiner*—Richard T. Elms
*Assistant Examiner*—Eric J. Wendler
(74) *Attorney, Agent, or Firm*—Morrison & Foerster LLP

(57) ABSTRACT

An erroneous operation preventing circuit of an electrically rewritable non-volatile memory device is for setting one or more operational modes of a plurality of operational modes including at least a first reading mode of reading out data from a memory array 4, a programming mode, an erasing mode and a second reading mode of reading out data not stored in the memory array 4, in accordance with an input control command, and for performing a predetermined process in the set operational modes. The erroneous operation preventing circuit comprises an operational mode enforcing circuit 2a for setting the first reading mode regardless of the input of the control command, in a data protection status where the programming mode and the erasing mode are inhibited from being set in accordance with a control signal for protecting predetermined data.

10 Claims, 7 Drawing Sheets

FIG. 10        Prior Art
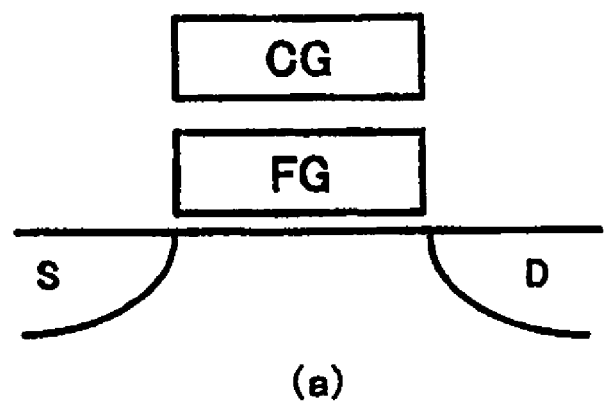
(a)
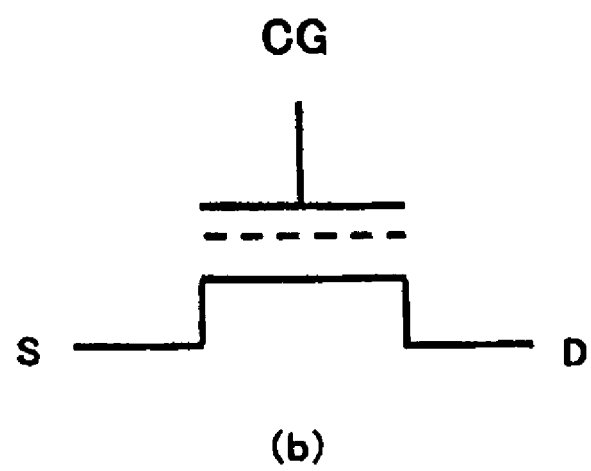
(b)

ERRONEOUS OPERATION PREVENTING CIRCUIT OF NON-VOLATILE MEMORY DEVICE

CROSS-REFERENCE TO RELATED APPLICATIONS

This nonprovisional application claims priority under 35 U.S.C. §119(a) on patent application No. 2003-109252 filed in Japan on Apr. 14, 2003, the entire contents of which are hereby incorporated by reference.

BACKGROUND OF THE INVENTION

1. Field of the Invention

The present invention relates to an electrically rewritable non-volatile memory device, and more specifically to an erroneous operation preventing circuit of a non-volatile memory device for setting one operational mode of a plurality of operational modes including at least a first reading mode of reading out data from a memory array, a programming mode of writing data to the memory array, an erasing mode of erasing data from the memory array and a second reading mode of reading out data not stored in the memory array, in accordance with an input of control command and for performing a predetermined process in the set operational mode.

2. Description of Related Art

As electrically rewritable non-volatile semiconductor memory devices, flash memories are known. In the flash memories, data writing operation to a memory array is carried out by means of a data writing (programming) command. In addition, erasing operation of data written to the memory array is carried out by means of an erasing command, whereby all the memory cells of the memory array simultaneously turn into an erasing status in a block unit.

For this reason, in order to carrying out the reading operation, the writing (programming) operation, the erasing operation in a block unit (or in a sector unit), etc. on the flash memory, it is necessary to first allow the flash memory to read out control commands corresponding to each operation, and then to allow a command condition decoding circuit to decode the operation details. In the flash memory, in order to maintain a data maintenance characteristic with a high quality, the above writing operation and erasing operation are controlled by a writing/erasing control circuit in accordance with complex writing and erasing algorithms. Further, since processing statuses such as start and end of the writing operation and the erasing operation are stored in a status register, the current processing statuses of the writing/erasing control circuit can be externally confirmed by reading out contents stored in the status register. An example of the control commands for the flash memory is listed in Table 1.

TABLE 1

| commands | First writing cycle Data input | Second writing cycle Data input |
| --- | --- | --- |
| Array reading/reset | FFH | — |
| programming | 40H | Writing data |
| Block erasing | 20H | D0H |
| Status register reading | 70H | — |
| Block lock | 60H | 01H |

TABLE 1-continued

| commands | First writing cycle Data input | Second writing cycle Data input |
| --- | --- | --- |
| Block unlock | 60H | D0R |
| Block lock-down | 60H | 2FH |

For example, in the array reading operation, when the flash memory receives a command data "FFH" (here, "H" indicates that the data is a hexadecimal expression) via data terminals (in general, the same data terminals are used for input and output of data), and then both of a chip enable signal CE# and an output enable signal OE# become active (here, "#" in the signal names expediently means that the signals having "#" become active when an input level is a low level), the data reading from the memory array is started. In a predetermined time after the start, the flash memory outputs from the data terminals data stored in an address area specified correspondingly to the input level of an address input terminal in the memory array.

In order to input the respective control commands to the flash memory, codes corresponding to the commands shown in Table 1 are input to the data terminals, and both of the chip enable signal CE# and a write enable signal WE# are made to be active.

FIG. 10A is a cross-sectional view schematically illustrating a sectional structure of a memory cell transistor constituting one memory cell in the flash memory. The memory cell transistor of FIG. 10A is formed on a surface region of, for example, a p type semiconductor substrate (or well). The memory cell transistor comprises a source S and a drain D into which n type impurities are injected, a floating gate FG formed on a channel region between the source S and the drain D with a gate insulating film therebetween, and a control gate CG formed on the floating gate FG with an interlayer insulating film therebetween. The floating gate FG is surrounded with an insulating film, and is in an electrical floating status. FIG. 10B is an equivalent circuit diagram of the memory cell transistor shown in FIG. 10A.

While not shown, the control gate CG is connected to a word line WL, and is driven by a word line driving circuit (a row decoder). Further, the drain D is connected to a bit line BL, is driven by a bit line driving circuit (a column decoder) and a sense amplifying circuit (a sense circuit), whereby potential of the bit line is amplified by the sense amplifier to read out data stored in the memory cell. The source S is coupled to a source line driving circuit through a source line.

In the flash memory, such memory cells are arranged in an array shape, each row of memory cells is connected to a corresponding word line WL, and each column of memory cells is connected to a corresponding bit line BL, thereby forming a memory cell array. Writing, erasing and reading of data on the memory cell shown in FIG. 10 are performed as follows.

In writing data, a high voltage Vpp of about 12V is applied to the control gate CG through the word line WL, a voltage of about 6V is applied to the drain D through the bit line BL, and a ground potential is applied to the source S from the source line driving circuit. In this status, a current flows from the drain D to the source S through the channel region. Electric charges in the current from the drain D is excited by means of a high electric field formed around the drain D, and thus hot electrons are generated. The hot electrons cause an avalanche breakdown, and thus a-large amount of hot electrons are serially generated. The hot electrons generated due to the avalanche breakdown are accelerated toward the floating gate FG by means of a high voltage applied to the control gate CG, and are injected into and caught by the floating gate FG. In a status where electrons are caught by the floating gate FG, a threshold voltage Vth of the memory cell transistor is shifted in a positive direction (that is, data "0" is stored).

In erasing data, the ground potential is applied to the control gate CG, the high voltage Vpp of about 12V is applied to the source S from a source potential generating circuit, and the drain D is in a floating status. In this status, electrons are extracted to the source S from the floating gate FG through the gate insulating film (which is a very thin tunnel insulating film) by means of a tunneling effect. In the status where the electrons are extracted from the floating gate FG, the threshold voltage Vth of the memory cell transistor is shifted in a negative direction (that is, data "1" is stored). As described above, the memory cell memorizes data "0" or "1" in accordance with the amount of electrons existing in the floating gate FG. This erasing operation is carried out in a block unit, where the memory array is divided into a plurality of blocks (all the data may be erased in a bundle from the whole memory array, depending upon erasing mechanisms or sizes of the memory arrays).

After turn-on of power or after restoration from reset operation, the flash memory is in an operational mode (an array reading mode) of reading out data of the memory cell shown in FIG. 10. For this reason, in a computer system storing program codes, etc. in the flash memory, a CPU can read out the corresponding program code suitably for the situations. However, when a status register reading command is generated, the flash memory is in a status register reading mode, and thus data from the status register, not data from the memory array, are output. As a result, the CPU having been reading out data (programs or data, etc.) from the flash memory reads out erroneous data. In this way, when the status register reading mode is erroneously set, the computer system (CPU) starts runaway (erroneous operation).

On the other hand, when an erasing command or a programming command is issued to the flash memory, a writing/erasing control circuit starts the erasing operation or the writing operation. When the writing/erasing control circuit starts the erasing operation or the writing operation, the flash memory is automatically set to the status register reading mode. This is because the intentional input of the status register reading command is not necessary for confirmation of the processing statuses in the programming mode or the erasing mode. Therefore, there is no problem in the normal operation, but when the programming mode or the erasing mode is erroneously set due to noises, etc., the flash memory may output erroneous data, and the computer system (CPU) reading out the erroneous data may thus start the runaway (erroneous operation).

Here, a bit 7 (eighth bit) of bits of the status register is "1" (Ready) when the writing/erasing control circuit is in a wait status, for example, in the array reading mode, etc. When the writing/erasing control circuit starts controlling the erasing operation or the writing operation, the bit 7 of the status register turns into "0" (Busy), and when the erasing operation or the writing operation is completed, the bit 7 is restored to "1" (Ready), thereby notifying completion of the erasing operation or the writing operation.

In order to restore the operational mode from the status register reading mode to the operational mode (array reading mode) of reading out data from the memory array, the array reading command FFH should be issued. Thereafter, the flash memory can read out data from the memory array.

FIG. 11 illustrates an arrangement example of terminals of the flash memory. FIG. 11 shows an example of a product in which the flash memory is sealed with a 48-pin TSOP package.

As a case where the status register reading mode is set in addition to the above description, when a VPP terminal (an input terminal of writing/erasing high voltage) turns into a low level, the writing operation or the erasing operation is inhibited, but the flash memory may be set to the status register reading mode. In addition, when a WP# terminal (an input terminal of a write protecting control signal) turns into a low level, the data writing operation and the data erasing operation on a specific block of the memory array are inhibited, but the flash memory may be set to the status register reading mode.

In addition, methods of preventing the writing operation and the erasing operation on the specific block are disclosed in Japanese Patent Unexamined Publication JP-A 9-69066 (1997) (Patent Document 1) and Japanese Patent Unexamined Publication JP-A 2002-366436 (2000) (Patent Document 2). Patent Document 1 discloses a method in which a protection status setting unit is provided in each block, so that when a block requiring a protection status is set by the protection status setting unit, the writing/erasing operation on the corresponding block is prevented, and when the protection status is released by the protection status setting unit, the writing/erasing operation is enabled. Patent Document 2 discloses a method in which in a circuit or system having a non-volatile memory which is rewritable every block, when the writing operation is carried out on a block specified by a protection area specifying unit, only a high level signal is supplied to the WE# terminal, and on the contrary, when the writing operation is carried out on a block not specified by the protection area specifying unit, an active signal (a low level) is supplied to the WE# terminal, thereby writing commands and data.

However, in the above two methods, when the WE# signal is fixed to a high level, the rewriting operation is prevented and only the reading operation is enabled by the protection area specifying unit. Therefore, if a situation (erroneous writing operation) where the WE# signal erroneously turns into the active level (a low level) is caused due to system noises, etc., that is, if an erroneous control command is received, there is a possibility that restoration from the status register reading mode could not be performed.

When control commands (for example, 20H, 40H, 70H) other than FFH is erroneously input to the flash memory due to system noises, etc. unexpectedly generated in turn-on of power or electrical connection, the flash memory is automatically set to the status register reading mode. Thereafter, when both of the chip enable signal CE# and the output enable signal OE# become active, the reading operation on the status register is started, and in a predetermined time after the starting, the flash memory outputs values of the status register to the data terminal.

Since the flash memory does not output data (program code, etc.) stored in an address area specified correspondingly to an input level of an address input terminal in the memory array, the CPU having been reading out the data starts the runaway (erroneous operation). In the circuit or system having a non-volatile memory which is rewritable in every block, which is disclosed in Patent Document 2, when the writing operation is carried out on a block specified by a protection area specifying unit, the rewriting operation is prevented and only the reading operation is enabled, so that only a high level signal is supplied to the WE# terminal, and on the contrary, when the writing operation is carried out on a block not specified by the protection area specifying unit, an active signal (a low level signal) is supplied to the WE# terminal, thereby reading out the control commands and the stored data.

In this case, if the signal level of the WE# signal is changed due to system noises, etc. unexpectedly generated in turn-on of power or electrical connection and thus the flash memory erroneously reads out the control commands (for example, 20H, 40H, 70H) other than FFH (array reading/reset), the flash memory is automatically set to the status register reading mode. When the wring operation is carried on a block specified by the protection area specifying unit, only a high level signal is normally supplied to the WE# terminal, so that the flash memory may not release the status register reading mode.

SUMMARY OF THE INVENTION

The present invention is contrived in view of the above problems, and it is thus an object of the present invention to provide an erroneous operation preventing circuit of a non-volatile memory device for preventing erroneous operation of reading out erroneous data in a circuit due to system noises, etc., when data in a memory array should be read out, and to guarantee stable operation in a computer system storing program codes, etc. in a flash memory.

In order to accomplish the above object, according to a first aspect of the present invention, there is provided an erroneous operation preventing circuit of an electrically rewritable non-volatile memory device for setting one or more operational modes of a plurality of operational modes including at least a first reading mode (for example, an array reading mode) of reading out data from a memory array, a programming mode of writing data to the memory array, an erasing mode of erasing data from the memory array and a second reading mode (for example, a status register reading mode) of reading out data not stored in the memory array, in accordance with an input control command, and for performing a predetermined process in the set operational modes, the circuit comprising an operational mode enforcing circuit for setting the first reading mode regardless of the input control command, in a data protection status where the programming mode and the erasing mode are inhibited from being set in accordance with a control signal for protecting predetermined data.

Further, according to a second aspect of the present invention, the erroneous operation preventing circuit of the non-volatile memory device according to the first aspect of the present invention may further comprise a data protection area specifying unit for specifying a data protection area such that the data protection status would be valid only in the specified data protection area in the memory array, and the operational mode enforcing circuit may set the first reading mode regardless of the input control command, when the data protection area is specified by means of an input address in the data protection status. Furthermore, according to a third aspect of the present invention, the operational mode enforcing circuit may allow the operational mode to be set in accordance with the input control command, in a status where the programming mode and the erasing mode are not inhibited from being set in accordance with the control signal.

More specifically, the erroneous operation preventing circuit of the non-volatile memory device according to the present invention comprises the operational mode enforcing circuit for preventing the non-volatile memory device from being set to the status register reading mode due to system noises, etc. unexpectedly generated in a turn-on of a power or electrical connection, so that even when a control command of setting the status register reading mode is input, the non-volatile memory can be enforcedly set to the array reading mode. In addition, the erroneous operation preventing circuit may be further provided with the circuit for releasing the enforcement of the non-volatile memory device to the array reading mode and allowing the non-volatile memory device to be set to the status register reading mode.

Furthermore, in order to accomplish the above object, according to a fourth aspect of the present invention, there is provided an erroneous operation preventing circuit of an electrically rewritable non-volatile memory device for setting one or more operational modes of a plurality of operational modes including at least a first reading mode (for example, an array reading mode) of reading out data from a memory array, a programming mode of writing data to the memory array, an erasing mode of erasing data from the memory array and a second reading mode (for example, a status register reading mode) of reading out data not stored in the memory array, in accordance with an input control command, and for performing a predetermined process in the set operational modes, the circuit comprising an operational mode enforcing circuit for enforcedly setting an inner level of a control command input circuit to an inner level corresponding to the first reading mode regardless of an input level of the control command, in a data protection status where the programming mode and the erasing mode are inhibited from being set in accordance with a control signal for protecting predetermined data.

In addition, according to a fifth aspect of the present invention, the erroneous operation preventing circuit of the non-volatile memory device according to the fourth aspect of the present invention may further comprise a data protection area specifying unit for specifying a data protection area such that the data protection status would be valid only in the specified data protection area in the memory array, and the operational mode enforcing circuit may enforcedly set the inner level of the control command input circuit to the inner level corresponding to the first reading mode regardless of the input level of the control command, when the data protection area is specified by means of an input address in the data protection status. In addition, according to a sixth aspect of the present invention, the operational mode enforcing circuit may set the inner level of the control command input circuit to the inner level corresponding to the input level of the control command, in a status where the programming mode and the erasing mode are not inhibited from being set in accordance with the control signal.

In the erroneous operation preventing circuit of the non-volatile memory device according to the first to sixth aspects of the present invention, a control command, for example, a block erasing command 20H, a programming command 40H, or a status reading command 70H, other than an array reading/reset command FFH cannot be erroneously input to the flash memory due to system noises, etc. unexpectedly generated in a turn-on of power or electrical connection, and thus the flash memory cannot be set to a status register reading mode. As a result, in a computer system storing program codes, etc. in the flash memory, since contents (program codes) of an address input to an address terminal of the flash memory are normally output from the data terminal, and thus the CPU of the computer system continues to perform the normal operation, it is possible to prevent the erroneous erasing operation and the erroneous writing operation on the non-volatile memory device due to runaway of the system or erroneous operation of the CPU.

Specifically, the erroneous operation preventing circuit of the non-volatile memory device according to the second or fifth aspect of the present invention further comprises a protection area specifying unit, and when the control signal indicates prevention of the erasing/writing operation on the non-volatile memory device, an operational mode other than the array reading mode can be allowed in areas not specified by the protection area specifying unit, so that it is possible to read out contents of the status register from the areas not specified by the protection area specifying unit.

Specifically, in the erroneous operation preventing circuit of the non-volatile memory device according to the third or sixth aspect of the present invention, when the control signal does not indicate prevention of the erasing/writing operation on the non-volatile memory device, the whole area of the memory array can be set to an operational mode other than the array reading mode, so that it is possible to read out the contents of the status register from the whole area of the memory array.

BRIEF DESCRIPTION OF THE DRAWINGS

The above and other features and advantages of the present invention will become more apparent from detailed description of exemplary embodiments thereof with reference to the accompanying drawings in which:

FIG. 10A is a cross-sectional view illustrating a sectional structure of a memory cell transistor of a flash memory, and FIG. 10B is an equivalent circuit diagram thereof.

DETAILED DESCRIPTION OF THE INVENTION

Now, preferred embodiments of the erroneous operation preventing circuit (hereinafter, referred to as "circuit of the present invention" in brief) of the non-volatile memory device according to the present invention will be described with reference to the accompanying drawings.

Figure 1:
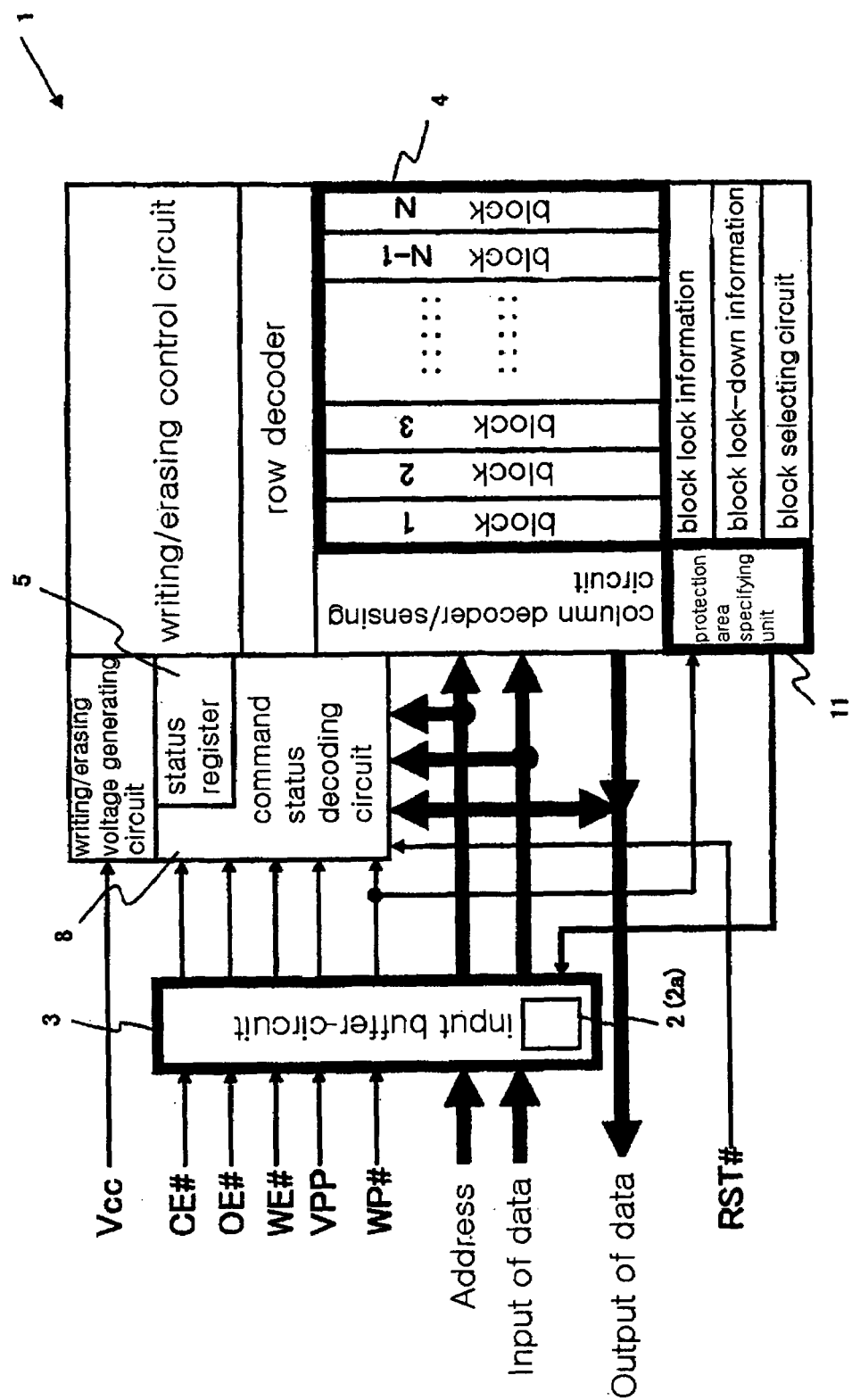
FIG. 1 is a block diagram schematically illustrating a configuration of an embodiment of a non-volatile memory device according to the present invention.

First, a block diagram schematically illustrating a configuration of the non-volatile memory device 1 according to the present invention is shown in FIG. 1. The circuit 2 of the present invention is provided in an input buffer circuit 3. The non-volatile memory device according to the present invention is similar to the usual non-volatile memory device described above, except for the circuit 2 of the present invention.

As the non-volatile memory device 1, an electrically rewritable flash memory is exemplified, which internally sets at least one operational mode of a plurality of operational modes, for example, the plurality of operational modes shown in Table 1, including at least an array reading mode (an example of a first reading mode) of reading out data from a memory array 4, a programming mode of writing data to the memory array 4, an erasing mode of erasing data from the memory array 4 and a status register reading mode (an example of a second reading mode) of reading out data stored in a status register 5 other than the memory array 4, in accordance with a control command input from a data terminal, and performs a predetermined process in the set operational mode.

Figure 2:
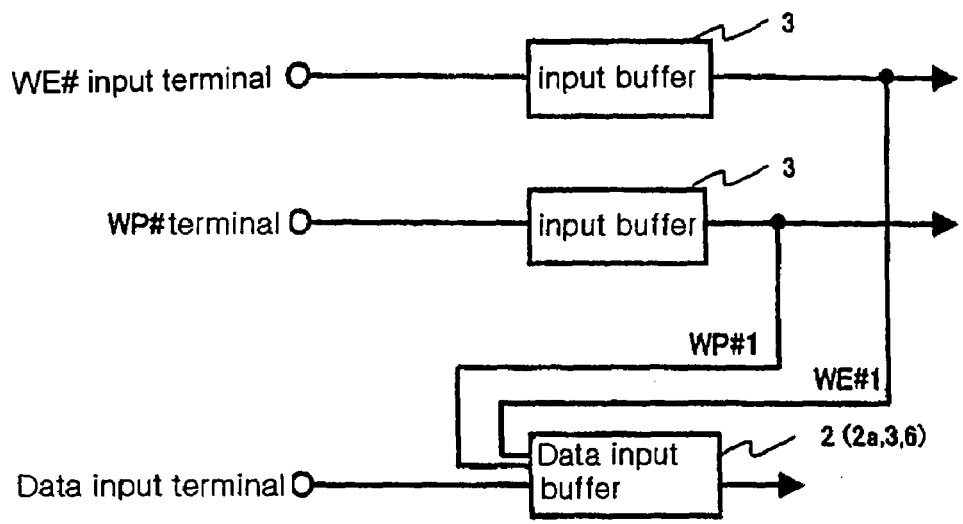
FIG. 2 is a block diagram illustrating a circuit configuration in a first embodiment of an erroneous operation preventing circuit of the non-volatile memory device according to the present invention.

Now, a first embodiment of the circuit 2 of the present invention will be described with reference to FIGS. 2 and 3. FIG. 2 is a block diagram illustrating a circuit configuration of the circuit 2 of the present invention, where the circuit 2 of the present invention comprises a data input buffer circuit 6 of an input buffer circuit 3, and is associated with an input buffer circuit having a WE# input terminal and an input buffer circuit having a WP# input terminal. Here, the data input buffer circuit 6 (an example of an operational mode enforcing circuit 2a) is generally controlled by means of a WP# input signal (which is an example of a control signal for protecting data and is a control signal specified for protecting data independently provided) from the WP# input terminal (a write protecting terminal) in addition to a WE# input signal from the WE# input terminal (which becomes active at a low level "0" and receives data (writing data or control commands) input from the data input terminal), so that when the WP# input signal turns into a low level "0", the data input from the data input terminal are disabled. As a result, the input of control commands is impossible.

Figure 3:
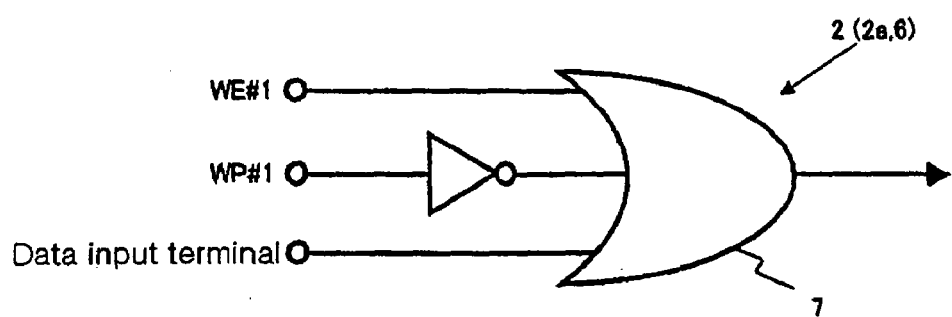
FIG. 3 is a logic circuit diagram of a data input buffer circuit constituting the erroneous operation preventing circuit of the non-volatile memory device according to the present invention, in the first embodiment shown in FIG. 2.

Furthermore, as shown in a logic circuit diagram of the data input buffer circuit 6 in FIG. 3, when the WP# input signal turns into a low level "0" regardless of an input level of data (control commands) externally supplied to the data input terminal (in many cases, the same data terminal is used for input and output of data), an OR (logical sum) gate 7 outputs a high level "1". If the WE# terminal turns into a low level "0" when the WP# input signal is at a high level "1", the OR gate 7 outputs an inner level corresponding to an input level of the input data (control command). Therefore, when the WP# input signal turns into a low level "0", that is, an active status, to establish a data protection status in which the programming mode and the erasing mode are prevented from being set, the OR gate 7 enforcedly outputs a high level "1", so that when the input data is 8 bit data, the same status as inputting a control command "FFH" is set. Then, a command status decoding circuit 8 determines that the data "FFH" (which corresponds to an array reading/reset command in this embodiment) determined at the inner level is received.

In this way, when the data protection status is set by means of the WP# input signal, the input level of the data input terminal turns into a level corresponding to, for example, a control command "40H" due to system noises, etc. and both of a chip enable signal CE# and a write enable signal WE# of the flash memory 1 are activated, it is intended to read out the control command "40H". However, since the data "FFH" is enforcedly set as an inner level (the output of the OR gate 7) of the flash memory 1, flash memory 1 is set to the array reading mode without being erroneously set to the programming mode corresponding to the control command "40H" and being set to the status register reading mode as a reading mode, so that data of the memory array at an address indicated by an input level of an address terminal are output to the data terminal. That is, since contents (program codes, etc.) of the memory array 4 accessed by means of the input address are output to the data terminal, the CPU continues to perform normal operation. In addition, when the WP# terminal turns into a high level, the data input from the data input terminal is available, so that it is possible to read internally the external data through the data input terminal.

Figure 4:
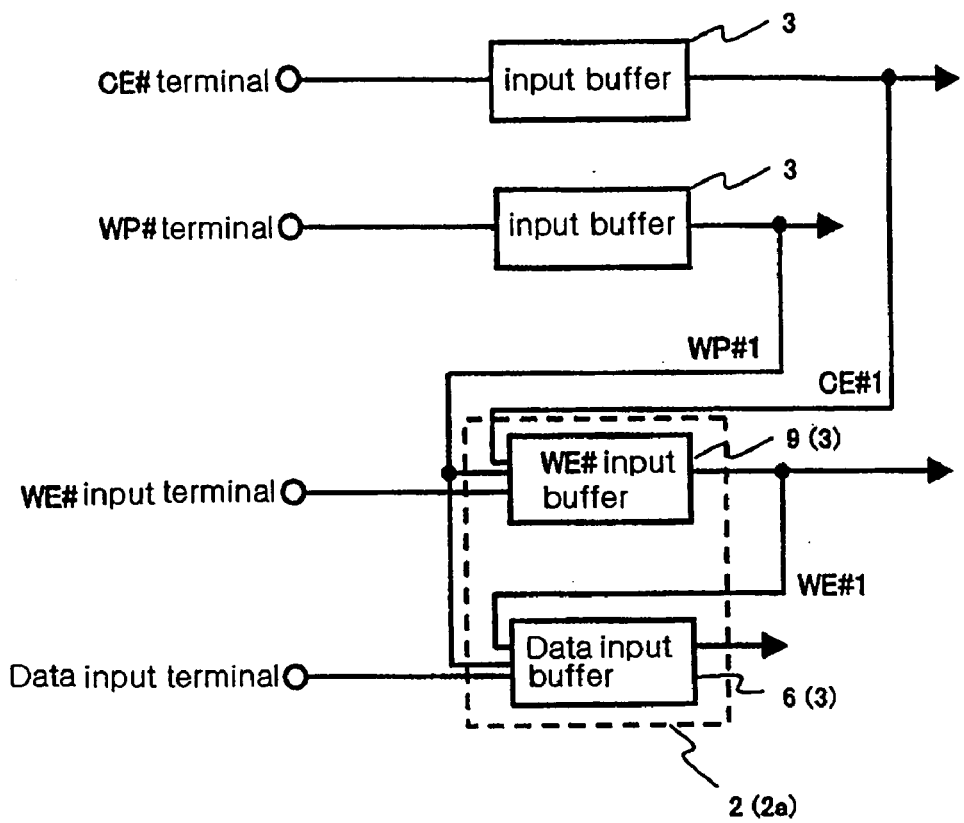
FIG. 4 is a block diagram illustrating a circuit configuration in a second embodiment of the erroneous operation preventing circuit of the non-volatile memory device according to the present invention.
Figure 5:
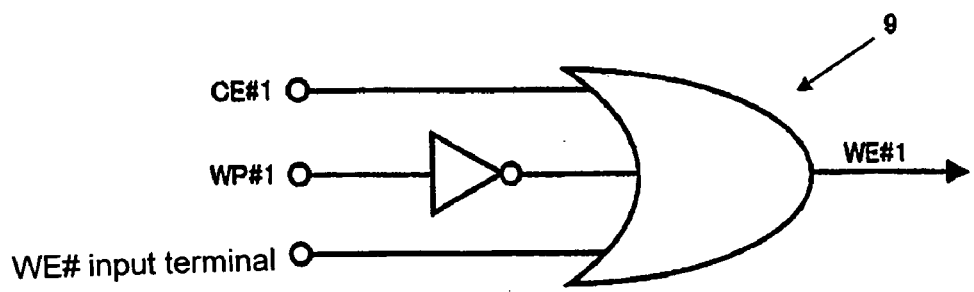
FIG. 5 is a logic circuit diagram of an input buffer circuit having a WE# input terminal and constituting the erroneous operation preventing circuit of the non-volatile memory device according to the present invention, in the second embodiment shown in FIG. 4.

Now, a second embodiment of the circuit 2 of the present invention will be described with reference to FIGS. 4 and 5. FIG. 4 is a block diagram illustrating a circuit configuration of the circuit 2 of the present invention, where the circuit 2 of the present invention comprises a data input buffer circuit 6 of the input buffer circuit 3 and an input buffer circuit 9 having a WE# input terminal, and is associated with an input buffer circuit having the WP# input terminal and an input buffer circuit having the CE# input terminal. The data input buffer circuit 6 and the input buffer circuit 9 having the WE# input terminal constitute the operational mode enforcing circuit 2a. FIG. 5 is a logic circuit diagram illustrating a circuit configuration of the input buffer circuit 9 having the WE# input terminal. Here, the data input buffer circuit 6 has the same circuit configuration as shown in FIG. 3, similarly to the first embodiment.

When the WP# input signal turns into a low level "0", as shown in FIGS. 3 and 5, the WE# input signal from the WE# terminal and the data input from the data input terminal are all disabled. In the configuration of the second embodiment, when a data protection status is set by means of the WP# input signal, the input level of the data input terminal turns into a level corresponding to, for example, a control command "40H" due to system noises, etc. and both of a chip enable signal CE# and the write enable signal WE# of the flash memory 1 are activated, it is intended to read out the control command "40H". However, since the data "FFH" is enforcedly set as an inner level (the output of the OR gate 7) of the flash memory 1, flash memory 1 is set to the array reading mode without being erroneously set to the programming mode corresponding to the control command "40H" and being set to the status register reading mode as a reading mode, so that data of the memory array 4 at an address indicated by an input level of an address terminal are output to the data terminal.

In the second embodiment, as shown in FIG. 5, a WP#1 signal in the input buffer circuit 3 due to the WP# input signal is also input to the input buffer circuit 9 having the WE# input terminal. Therefore, even if noises are superposed on the WP#1 signal in the input buffer circuit 3 and the data input buffer circuit 6 receives the input data, since the input buffer circuit 9 having the WE# input terminal outputs a high level "1", influence of the noises in the WP#1 signal on a WE#1 signal is delayed, so that a possibility that the WP#1 signal and the WE#1 signal simultaneously turn into a low level "0" is decreased. Accordingly, the OR gate 7 of the data input buffer circuit 6 maintains an output of a high level "1". As a result, the command status decoding circuit 8 determines that the data "FFH" (which corresponds to an array reading/reset command in this embodiment) determined at the inner level is received, and the flash memory 1 turns into the array reading mode, so that contents of the memory array 4 at the address specified by the input level of the address terminal are output to the data terminal. That is, since the contents (program codes, etc.) of the memory array 4 accessed by an input address are output to the data terminal, the CPU continues to perform normal operation. In addition, when the WP# terminal turns into a high level, the data input from the data input terminal are available, and thus the external data can be internally read out from the data input terminal.

Figure 6:
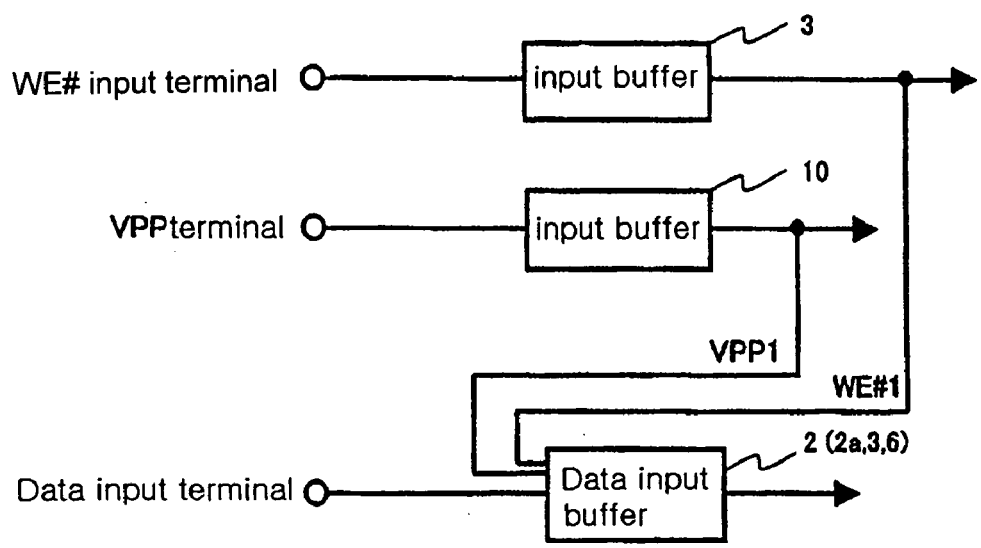
FIG. 6 is a block diagram illustrating a circuit configuration in a third embodiment of the erroneous operation preventing circuit of the non-volatile memory device according to the present invention.
Figure 7:
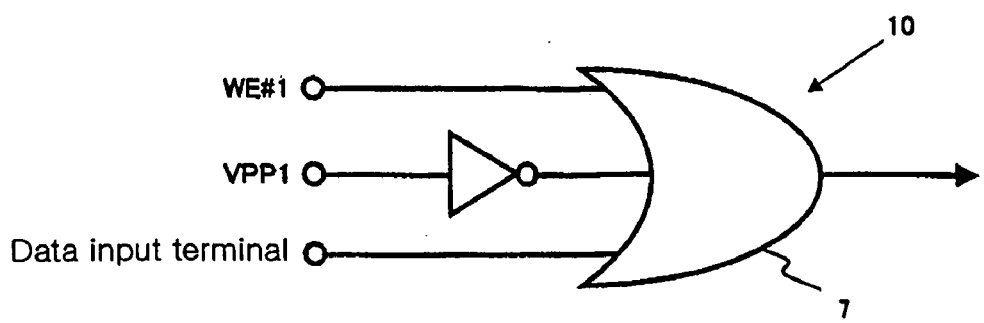
FIG. 7 is a logic circuit diagram of a data input buffer circuit constituting the erroneous operation preventing circuit of the non-volatile memory device according to the present invention, in the third embodiment shown in FIG. 6.

Now, a third embodiment of the circuit 2 of the present invention will be described with reference to FIGS. 6 and 7. FIG. 6 is a block diagram illustrating a circuit configuration of the circuit 2 of the present invention, where the circuit 2 of the present invention comprises a data input buffer circuit 6 (an example of the operational mode enforcing circuit 2a) in the input buffer circuit 3, and is associated with an input buffer circuit having a WE# input terminal and an input buffer circuit 10 having a VPP input terminal. FIG. 7 is a logic circuit diagram illustrating a circuit configuration of the data input buffer circuit 6. The third embodiment is different from the first embodiment, in that the VPP input signal from a VPP terminal for supply a writing/erasing high voltage is used in place of the WP# input signal from the WP# terminal. In addition, the flash memory 1 according to this embodiment is constructed such that when the VPP input signal is at a low level, a data protection status in which the programming mode and the erasing mode are prevented from being set is set.

When the VPP input signal turns into a low level, an inner signal VPP1 which is an output of an input buffer circuit 10 having the VPP input terminal turns into a low level "0" to disable the data input from the data input terminal in the data input buffer circuit 6 shown in FIG. 7, the output of the OR gate 7 enforcedly turns into a high level "1", and when the input data has 8 bits, the same status as the input control command "FFH" is set. As a result, the input of control commands is impossible. Regardless of the control command input to the data input terminal, the command status decoding circuit 8 determines that the data "FFH" (which corresponds to an array reading/reset command in this embodiment) determined by means of the inner level indicated by the output of the OR gate 7 is received. Accordingly, the input level of the data input terminal turns into a level corresponding to, for example, a control command "40H" due to system noises, etc. and both of a chip enable signal CE# and the write enable signal WE# of the flash memory 1 are activated, it is intended to read out the control command "40H". However, since the data "FFH" is enforcedly set as an inner level (the output of the OR gate 7) of the flash memory 1, flash memory 1 is set to the array reading mode without being erroneously set to the programming mode corresponding to the control command "40H" and being set to the status register reading mode as a reading mode, so that data of the memory array 4 at an address identified by an input level of an address terminal are output to the data terminal. That is, since the contents (program codes, etc.) of the memory array 4 accessed by an input address are output to the data terminal, the CPU continues to perform normal operation. In addition, when the VPP input signal turns into a high level, the data input from the data input terminal is available, and thus the external data can be internally read out from the data input terminal.

Figure 8:
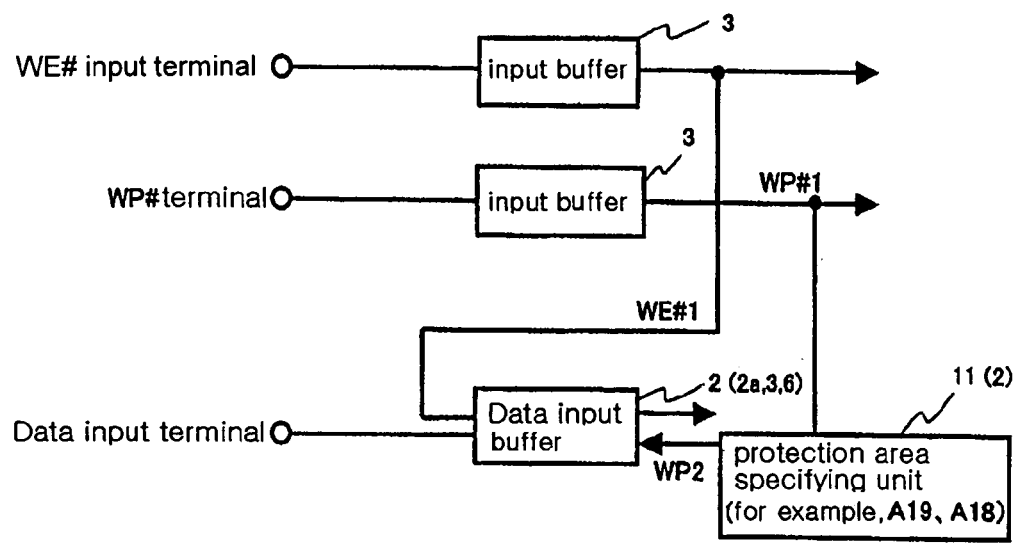
FIG. 8 is a block diagram illustrating a circuit configuration in a fourth embodiment of the erroneous operation preventing circuit of the non-volatile memory device according to the present invention.

Now, a fourth embodiment of the circuit 2 of the present invention will be described with reference to FIGS. 8 and 9. FIG. 8 is a block diagram illustrating a circuit configuration of the circuit 2 of the present invention, where the circuit 2 of the present invention comprises a data input buffer circuit 6 (an example of the operational mode enforcing circuit 2a) in the input buffer circuit 3 and a protection area specifying unit 11, and is associated with an input buffer circuit having a WE# input terminal and an input buffer circuit having a WP# input terminal.

Figure 9:
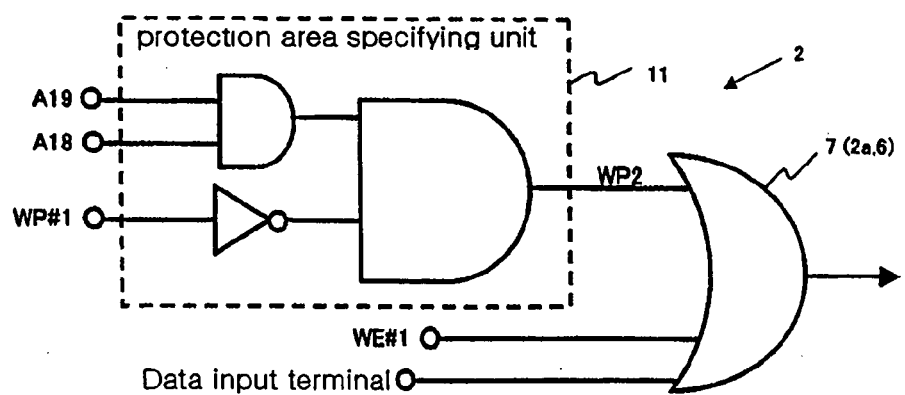
FIG. 9 is a logic circuit diagram of a data input buffer circuit and a protection area specifying unit constituting the erroneous operation preventing circuit of the non-volatile memory device according to the present invention, in the fourth embodiment shown in FIG. 8.
Figure 11:
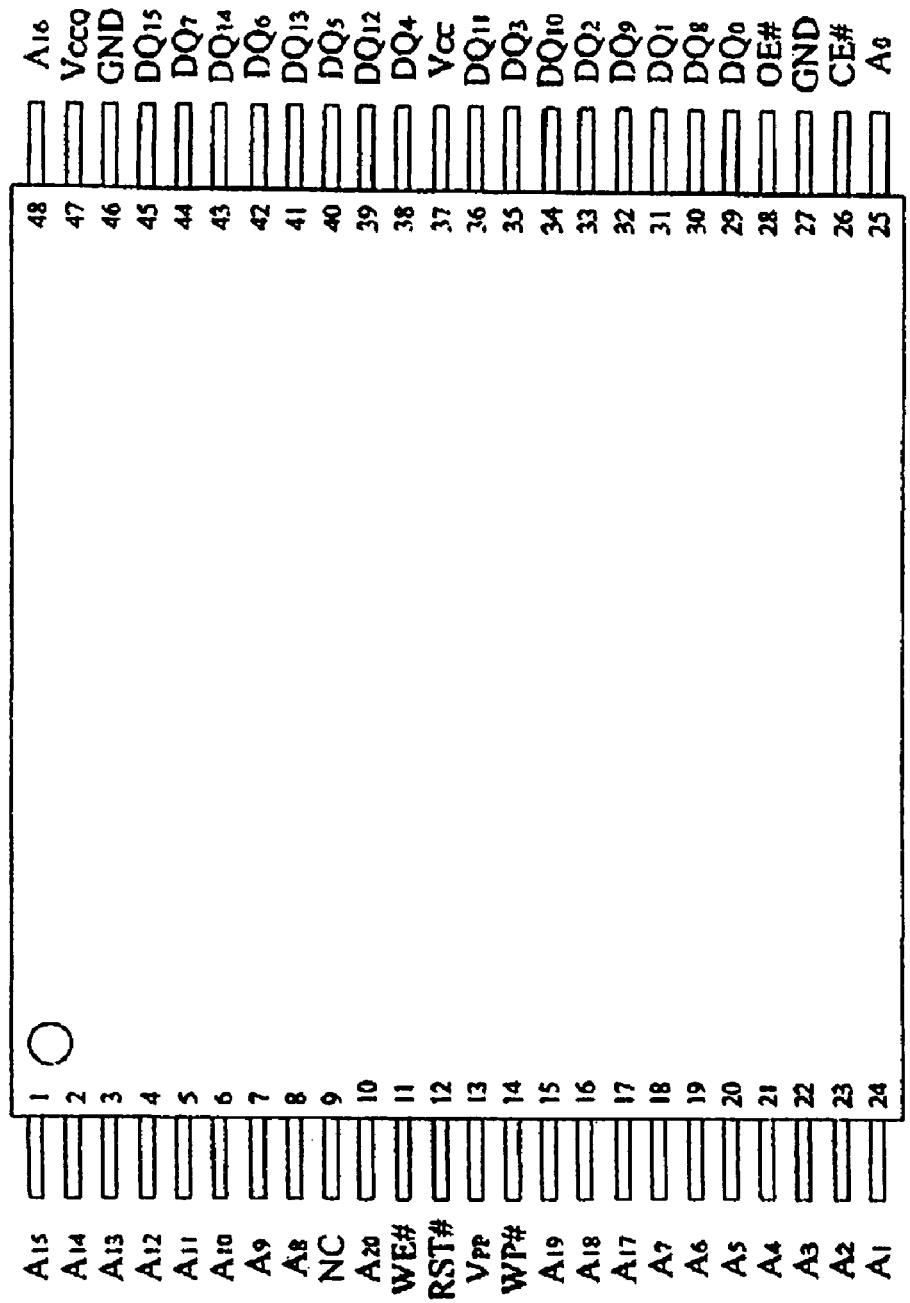
FIG. 11 is a diagram illustrating a terminal arrangement in a 48-pin TSOP package of the flash memory.

When the WP# input signal of the WP# terminal turns into a low level "0", an inner signal WP#l which is an output of the input buffer circuit having the WP# input terminal turns into a low level "0", and when address areas are specified as an address A19 and an address A18 by the protection area specifying unit 11 shown in FIG. 9, the protection area specifying unit 11 sets the inner signal WP2 to a high level "1" to disable the data input from the data input terminal to the data input buffer circuit 6. As a result, the input of control commands is impossible. In FIG. 9, for the simplification of the description, a logical processing when the areas where the address A19 and the address A18 all are specified at a high level "1" are specified as the data protection area is schematically illustrated, and thus the circuit configuration thereof is different from that of the real protection area specifying unit 11.

Moreover, as shown in the logic circuit diagram of the data input buffer circuit 6 and the protection area specifying unit 11 in FIG. 9, when the WP# input signal turns into a low level "0" regardless of an input level of the data (a control command) externally supplied to the data input terminal (in many cases, the same data terminal is used for input and output of data), the OR (logical sum) gate 7 outputs a high level "1". If the WE# terminal turns into a low level "0" when the WP# input signal is at a high level "1", the OR gate 7 outputs the inner level corresponding to the input level of the data (a control command). Therefore, when the WP# input signal turns into a low level "0", that is, an active status, to establish a data protection status in which the programming mode and the erasing mode are prevented from being set, the OR gate 7 enforcedly outputs a high level "1", so that when the input data is 8 bit data, the same status as inputting the control command "FFH" is set. Then, the command status decoding circuit 8 determines that the data "FFH" (which corresponds to an array reading/reset command in this embodiment) determined at the inner level is received.

In this way, when the data protection status is set by means of the WP# input signal, the input level of the data input terminal turns into a level corresponding to, for example, a control command "40H" due to system noises, etc. and both of a chip enable signal CE# and a write enable signal WE# of the flash memory 1 are activated, when an address input selects the address area specified by the protection area specifying unit 11 in the flash memory 1, it is intended to read out the control command "40H". However, since the data "FFH" is enforcedly set as an inner level (the output of the OR gate 7) of the flash memory 1, without being erroneously set to the programming mode corresponding to the control command "40H" and being set to the status register reading mode as a reading mode, so that the flash memory 1 is set to the array reading mode. As a result, data of the memory array 4 at an address specified by the input level of the address terminal are output to the data terminal. That is, since contents (program codes, etc.) of the memory array 4 accessed by means of the input address are output to the data terminal, the CPU continues to perform its normal operation. In addition, when the WP# terminal turns into a high level, the data input from the data input terminal is available, so that it is possible to internally read external data through the data input terminal.

Next, other embodiments of the circuit of the present invention will be described.

(1) Although the WP# input signal and the VPP input signal which are the external input signals to the non-volatile memory device 1 are exemplified as the control signals in the aforementioned embodiments, the control signals are not limited to the above input signals. The control signals may be internal signals generated in the non-volatile memory device 1 in accordance with the control commands. For example, as disclosed in Patent Document 1, a control signal WP# internally generated may be used. In addition, the WP# input signal or the VPP input signal may not be singly used, but both control signals may be combined for use.

(2) Another embodiment may have a circuit configuration that when the VPP input signal turns to a low level "0", the overall blocks (the whole area) of the memory array 4 are inhibited from being set to an operational mode other than the array reading mode, and when the WP# input signal turns to a low level "0", an area of the memory array 4 specified by the protection area specifying unit 11 is inhibited from being set to an operational mode other than the array reading mode.

(3) Although the control signal in the first, second and fourth embodiments is the WP# input signal and the control signal in the third embodiment is the VPP input signal, the VPP input signal may be used as the control signal in the second and fourth embodiments.

(4) Although a specific voltage level of the low level "0" of the VPP input signal is not mentioned in the aforementioned embodiments, it is preferable that the low level potential of the VPP input signal is defined as a CMOS level so as to maintain the compatibility with usual products as enough as possible. (5) Block lock (protection) information or block lock-down information of a flash memory (Intel Corp. Model No. 28F160C3) having a block lock command and a block lock-down command may be used for the protection area specifying unit 11.

(6) Although an independent device is considered as the non-volatile memory device 1 in the aforementioned embodiments, the non-volatile memory device may be formed as an external memory of a micro computer system on the same substrate as the CPU to form a single chip, thereby serving as a memory core.

(7) Although it is described in the aforementioned embodiments that the VPP terminal for supplying a writing/erasing high voltage is provided and the VPP input signal from the VPP terminal is used, the non-volatile memory device 1 may not have the VPP terminal. In addition, the writing/erasing high voltage may be supplied directly from an external device, or may be obtained by internally stepping up a voltage.

(8) Although the control command for setting an operational mode is input from the data terminal in the aforementioned embodiments, the control command may be input from, for example, an exclusive input terminal. In this case, in place of the data input buffer circuit described in the first through fourth embodiments, the same circuit configuration may be applied to the input buffer circuit for inputting the control command. The control commands are not limited to the codes exemplified in Table 1. When the array reading command is not "FFH", the circuit configurations described in the first through fourth embodiments may be modified such that output levels of the "0" bit portions of the array reading command are inverted. The number of bits of the commands is not limited to 8.

(9) Furthermore, although a flash memory is considered as the non-volatile memory device 1 in the aforementioned embodiments, the circuit of the present invention may be applied to an electrically rewritable non-volatile memory device other than a flash memory.

As described above in details, in the erroneous operation preventing circuit of the non-volatile memory device according to the present invention, since a control command (for example, 20H, 40H, 70H) other than FFH (an array reading/reset command) is not erroneously input to the flash memory (non-volatile memory device) due to system noises, etc. unexpectedly generated in the turn-on of power or electrical connection, the flash memory cannot be set to an operational mode other than the array reading mode. As a result, since address contents (program codes) on the memory array indicated by the address signal of the flash memory are output from the data terminal, and thus the CPU reading out the data continues to perform the normal operation, it is possible to prevent the erroneous erasing operation and the erroneous writing operation on the non-volatile memory device due to the erroneous input of control signals (CE#, OE#, WE#, VPP, WP#, address signals, etc.) from the CPU.

In addition, even when the flash memory is set to an operational mode other than the array reading mode due to noises, etc. in the turn-on of a power or the reset of the system, the array reading/reset command "FFH" is input to the flash memory by allowing both of the chip enable signal CE# and the writing enable signal WE# of the flash memory to be active, so that the flash memory is set to the array reading mode to output contents of the address input to the address terminal. As a result, since address contents (program codes) on the memory array of the flash memory indicated by the address signal are output to the data terminal, and the CPU continues to perform the normal operation, it is possible to prevent the erroneous erasing operation and the erroneous writing operation on the non-volatile memory device due to the erroneous operation. In addition, as described above, by implementing a non-volatile memory device comprising the circuit of the present invention and a computer system employing the non-volatile memory device, it is possible to obtain a non-volatile memory device and a computer system insensible to peripheral noises.

Although the present invention has been particularly shown and described with reference to exemplary embodiments thereof, it will be understood by those skilled in the art that various changes in form and details may be made therein without departing from the spirit and scope of the present invention as defined by the following claims.

What is claimed is:

1. An erroneous operation preventing circuit of an electrically rewritable non-volatile memory device which sets one or more of a plurality of operational modes including a first reading mode of reading out data from a memory array, a programming mode of writing data to the memory array, an erasing mode of erasing data from the memory array, and a second reading mode of reading out other data, in accordance with an input control command, and performing a predetermined process in the operational modes, the circuit comprising:

an operational mode enforcing circuit coupled to the memory array and configured to set the first reading mode regardless of the input control command, in a data protection status where the programming mode and the erasing mode are inhibited from being set in accordance with a control signal for protecting predetermined data in the memory array.

2. The erroneous operation preventing circuit according to claim 1, further comprising a data protection area specifying unit configured to specify a data protection area such that the data protection status is valid only in the specified data protection area in the memory array, wherein the operational mode enforcing circuit sets the first reading mode regardless of the input control command, when the data protection area is specified by an input address in the data protection status.

3. The erroneous operation preventing circuit according to claim 1, wherein the operational mode enforcing circuit sets the operational mode in accordance with the input control command, in a status where the programming mode and the erasing mode are not inhibited from being set in accordance with the control signal.

4. The erroneous operation preventing circuit of according to claim 1, wherein the control signal includes one or more control signals for data protection, a data-writing high voltage input signal, a data-erasing high voltage input signal and a data-writing/erasing high voltage input signal.

5. The erroneous operation preventing circuit according to claim 1, wherein, in the data protection status, data input to the memory device is disabled and input of control commands is prevented.

6. An erroneous operation preventing circuit of an electrically rewritable non-volatile memory device which sets one or more of a plurality of operational modes including a first reading mode of reading out data from a memory array, a programming mode of writing data to the memory array, an erasing mode of erasing data from the memory array, and a second reading mode of reading out other data, in accordance with an input control command, and performing a predetermined process in the operational modes, the circuit comprising:

an operational mode enforcing circuit coupled to the memory array and configured to set enforcedly an associated control command input circuit which is coupled to the operational mode enforcing circuit to a level corresponding to the first reading mode regardless of an input level of the control command, in a data protection status where the programming mode and the erasing mode are inhibited from being set in accordance with a control signal for protecting predetermined data in the memory array.

7. The erroneous operation preventing circuit according to claim 6, further comprising a data protection area specifying unit configured to specify a data protection area such that the data protection status is valid only in the specified data protection area in the memory array, wherein the operational mode enforcing circuit enforcedly sets the control command input circuit to the level corresponding to the first reading mode regardless of the input level of the control command, when the data protection area is specified by an input address in the data protection status.

8. The erroneous operation preventing circuit according to claim 6, wherein the operational mode enforcing circuit sets the control command input circuit to the level corresponding to the input level of the control command, in a status where the programming mode and the erasing mode are not inhibited from being set in accordance with the control signal.

9. The erroneous operation preventing circuit according to claim 6, wherein the control signal includes one or more control signals for data protection, a data-writing high voltage input signal, a data-erasing high voltage input signal and a data-writing/erasing high voltage input signal.

10. The erroneous operation preventing circuit according to claim 6, wherein, in the data protection status, data input to the memory device is disabled and input of control commands is prevented.

* * * * *